United States Patent

Savelli

[19]

[11] Patent Number: 6,133,777
[45] Date of Patent: Oct. 17, 2000

[54] SELECTOR CIRCUIT FOR THE SWITCHING OVER OF ANALOG SIGNALS WITH AMPLITUDES GREATER THAN THAT OF THE SUPPLY VOLTAGE

[75] Inventor: Laurent Savelli, Meylan, France

[73] Assignee: STMicroelectronics S.A., Gentilly, France

[21] Appl. No.: 09/263,758

[22] Filed: Mar. 5, 1999

[30] Foreign Application Priority Data

Mar. 13, 1998 [FR] France .................................. 98 03277

[51] Int. Cl.[7] .................................................. H03K 17/62
[52] U.S. Cl. .......................... 327/410; 327/407; 327/408
[58] Field of Search ..................................... 327/407, 408, 327/409, 410, 544, 545, 546; 307/66

[56] References Cited

U.S. PATENT DOCUMENTS

| Re. 36,179 | 10/1999 | Shimoda | 327/407 |
|---|---|---|---|
| 5,021,680 | 6/1991 | Zaw Win et al. | 326/38 |
| 5,371,705 | 12/1994 | Nakayama et al. | 365/789.09 |
| 5,925,905 | 7/1999 | Hanneberg et al. | 257/299 |
| 5,963,077 | 10/1999 | Kim | 327/408 |

FOREIGN PATENT DOCUMENTS

| 0 148 027 A2 | 12/1984 | European Pat. Off. . |
|---|---|---|
| 0 442 347 A2 | 2/1991 | European Pat. Off. . |
| 0 477 706 A2 | 9/1991 | European Pat. Off. . |

OTHER PUBLICATIONS

S. Tanaka et al., "A Programmable 256K CMOS EPROM With On–Chip Test Circuits," IEEE International Solid State Circuits Conference, Feb. 23, 1984, pp. 148–149.

*Primary Examiner*—Terry D. Cunningham
*Assistant Examiner*—Hai L. Nguyen
*Attorney, Agent, or Firm*—Theodore E. Galanthay; Allen, Dyer, Doppelt, Milbrath & Gilchrist, P.A.

[57] ABSTRACT

The selector circuit is particularly well suited to the switching over of two voltages VPP1 and VPP2, greater than the supply voltage Vcc of an integrated circuit without a priori knowledge of which of the two voltages is the highest. The selector circuit includes first and second switch circuits coupled by first and second MOS transistors whose well is biased by the output voltage of the selector circuit.

17 Claims, 1 Drawing Sheet

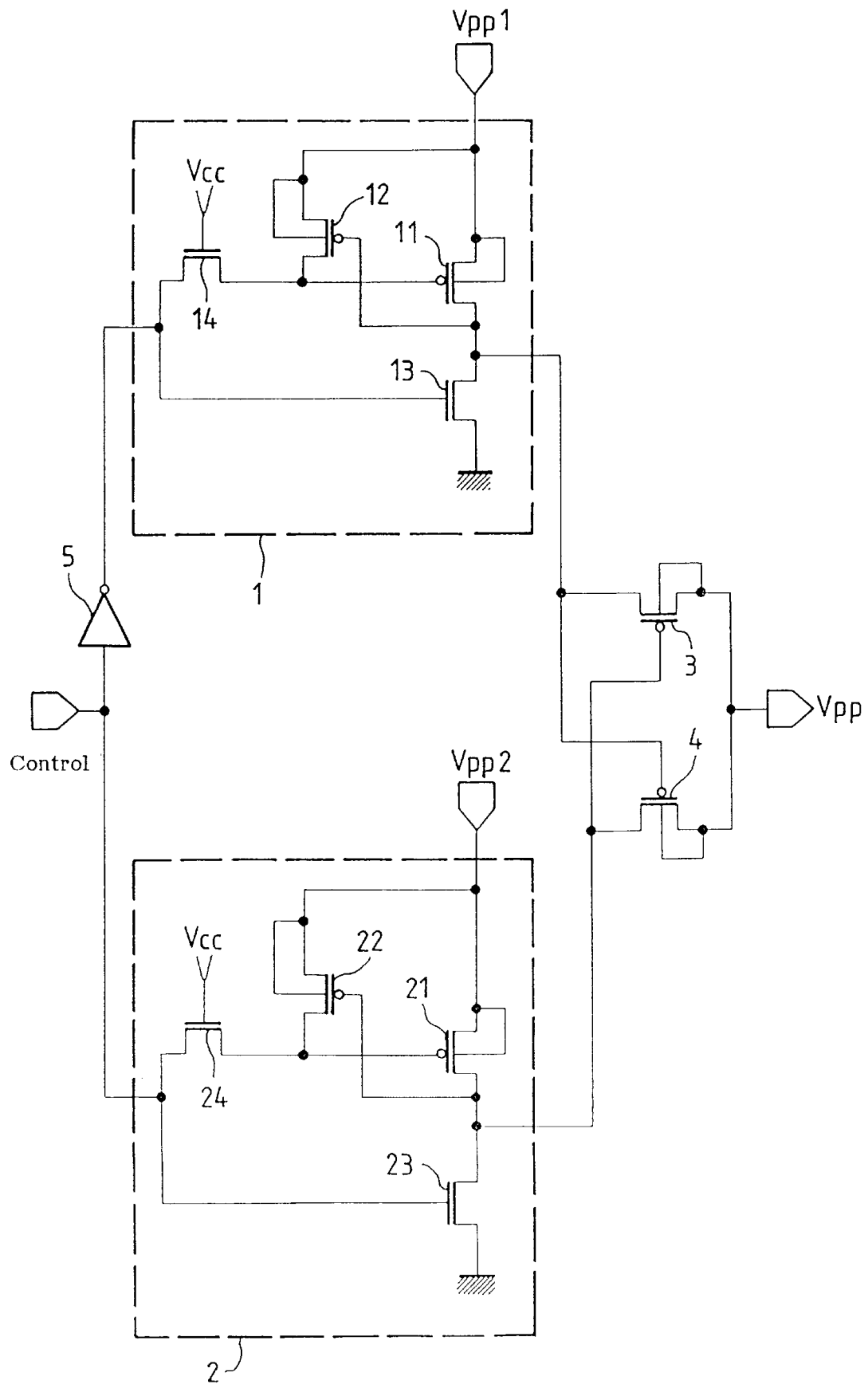

SELECTOR CIRCUIT FOR THE SWITCHING OVER OF ANALOG SIGNALS WITH AMPLITUDES GREATER THAN THAT OF THE SUPPLY VOLTAGE

FIELD OF THE INVENTION

The invention relates to electronic circuits, and, more particularly, to a selector circuit for the switching over of analog signals with certain amplitudes.

BACKGROUND OF THE INVENTION

Some integrated circuit make use of voltages greater than its supply voltage. This is especially the case for a circuit having a memory that requires high voltages to store and/or erase data. Several high voltages may be used. Conventionally, two approaches are used. A first approach includes the use of a charge pump that provides a voltage regulated as a function of the desired voltage. A second approach includes the use of several charge pumps and a selector circuit to switch over the different voltages, such as, for example, those indicated in the European application EP-A-0 750 397.

The selector circuits of the prior art use the highest voltage to for biasing so as to prevent any malfunctioning. Indeed, the switching over of positive voltage is generally done by a biased P channel MOS transistor. To prevent a reverse conduction of the P channel transistors, it is necessary that the well should be biased by a voltage at least equal to the highest voltage that could cross the P channel transistor. This because there is a risk that the reverse conduction of an output transistor may cause a collapse of the output voltage.

Since integrated circuits are becoming increasingly complex, it is becoming necessary to test increasing numbers of functional elements independently. To be able to test an integrated circuit independently of its charge pump, it proves to be worthwhile to make use of an external voltage to replace the output voltage of the charge pump. A problem then arises of determining the supply voltage of the selector circuit. Indeed, the circuit has to work independently. It is necessary that the charge pump should supply the selector circuit. Furthermore, in the test mode, it is necessary to use the external voltage which may be greater than the charge pump voltage.

SUMMARY OF THE INVENTION

The invention proposes a selector circuit that is particularly well suited to the switching over of two voltages greater than the supply voltage of an integrated circuit without a priori knowledge of which of the two voltages is the highest. Naturally, the invention can also be used when both the voltages are known.

An object of the invention is a selector circuit designed to switch over either to a first voltage or to a second voltage as a function of a control signal. The selector circuit preferably comprises a first switch circuit receiving the first voltage and the control signal and giving, at an output, either the first voltage when the control signal is in a first state or a first reference voltage when the control signal is in a second state. The selector circuit also includes a second switch circuit receiving the second voltage and the control signal and giving, at an output, either the second voltage when the control signal is in the second state or a first reference voltage when the control signal is in the first state. In addition, the selector circuit includes a first MOS transistor of a first type having its source connected to the output of the first switch circuit, its gate connected to the output of the second switch circuit, and its drain connected to its well. A second MOS transistor of the first type is provided and having its source connected to the output of the second switch circuit, its gate connected to the output of the first switch circuit, and its drain connected to its well and to the drain of the first MOS transistor.

Preferably, the first and second MOS transistors are made in a first well. The MOS transistors of the first type of the first switch circuit are made in a second well supplied with the first voltage. And, the MOS transistors of the first type of second switch circuit are made in a third well supplied with the second voltage.

The invention also relates to any integrated circuit with MOS transistors comprising a selector circuit as described herein.

BRIEF DESCRIPTION OF THE DRAWING

The invention will be understood more clearly and other particular features and advantages shall appear from the following description, made with reference to the sole FIG. 1 which shows a preferred embodiment of the invention.

DETAILED DESCRIPTION OF THE PREFERRED EMBODIMENT

FIG. 1 shows a selector circuit comprising:

a first switch circuit 1 comprising first and second inputs and one output, the first input receiving a first voltage Vpp1, the second input receiving a first control signal and the output giving either the first voltage Vpp1 when the first control signal is in a first state, or 0 V when the first control signal is in a second state;

a second switch circuit 2 comprising first and second inputs and one output, the first input receiving a second voltage Vpp2, the second input receiving a second control signal and the output giving either the second voltage Vpp2 when the second control signal is in a first state or 0 V when the second control signal is in a second state;

a first P type MOS transistor 3 having its source connected to the output of the first switch circuit 1, its gate connected to the output of the second switch circuit 2 and its drain connected to its well and forming the output of the selector circuit which gives a high voltage Vpp;

a second P type MOS transistor 4 having its source connected to the output of the second switch circuit 2, its gate connected to the output of the first switch circuit 1, and its drain connected to its well and to the drain of the first MOS transistor 3; and an inverter 5 having an input and an output, the input receiving the second control signal and the output giving the first control signal which is therefore the reverse of the second control signal.

It is assumed that the circuit is supplied with a supply voltage Vcc lower than the first and second voltages Vpp1 and Vpp2. When the second control signal is in a first state, for example, a logic "1", then the first interrupt circuit 1 gives the first voltage Vpp1 at its output. The second interrupt circuit 2 gives 0 volts at its outputs. The gate of the first transistor 3 therefore receives zero voltage, and its source receives the first voltage Vpp1. The first transistor is therefore on and biases the wells of the first and second transistors 3 and 4 at the first voltage Vpp1. The high voltage Vpp being equal to the first voltage Vpp1. The second transistor 4, which has its well biased at the first voltage Vpp1, receives the first voltage Vpp1 at its gate and drain and receives 0 volts at its source, and is therefore off.

When the second control signal is in the second state, for example, at logic "0", then the first switch circuit 1 gives 0 volts at its output. The second switch circuit 2 gives the second voltage Vpp2 at its output. The gate of the second transistor 4 therefore receives a zero voltage, its source receives the second voltage Vpp2. The second transistor is therefore on and biases the wells of the first and second transistors 3 and 4 at the second voltage Vpp2, the high voltage Vpp being equal to the second voltage Vpp2. The first transistor 3 which has its well biased at the second voltage Vpp2, receives the second voltage Vpp2 at its gate and drain and receives 0 volts at its source, and it is therefore off.

The first and second transistors 3 and 4 are made in one and the same well biased as a function of the output voltage Vpp. Since the output voltage Vpp is the highest voltage received by these two transistors at a given point in time, there is no risk of reverse conduction for the first transistor or the second transistor 3 or 4.

Furthermore, to limit the consumption of the selector circuit, wells will be used for each of the switch circuits 1 and 2. Indeed, the use of a common well biased by the output voltage Vpp would prompt reverse conduction for certain P MOS transistors of the switch circuits 1 and 2. This would risk creating a major level of static power consumption in the switch circuits 1 and 2.

Preferably, the first and second switch circuits 1 and 2 are made as indicated in the drawing of FIG. 1. The first switch circuit 1 comprises:

a third P type MOS transistor 11 whose drain forms the output of the first switch circuit 1, its source, which forms the first input of the first switch circuit 1, being connected to its well and receiving the first voltage vpp1;

a fourth P type MOS transistor 12 having its source connected to its well and to the source of the third MOS transistor 11, its gate connected to the drain of the third MOS transistor 11 and its drain connected to the gate of the third MOS transistor 11;

a fifth N type MOS transistor 13 having its drain connected to the drain of the third MOS transistor 11, its source connected to the ground, and its gate forming the second input of the first switch circuit 1; and a sixth N type MOS transistor 14 having its drain connected to the gate of the third MOS transistor 11, its source connected to the gate of the fifth MOS transistor 13 and its gate being connected to receive the supply voltage Vcc of the integrated circuit.

The second switch circuit 2 comprises:

a seventh P type MOS transistor 21, its drain forming the output of the second switch circuit 2, its source, which forms the first input of the second switch circuit 2, being connected to its well and receiving the second voltage Vpp2;

an eighth P type MOS transistor 22 having its source connected to its well and to the source of the seventh MOS transistor 21, its gate connected to the drain of the seventh MOS transistor 21 and its drain connected to the gate of the seventh MOS transistor 21;

a ninth N type MOS transistor 23 having its drain connected to the drain of the seventh MOS transistor 21, its source connected to the ground and its gate forming the second input of the second switch circuit 2; and a tenth N type MOS transistor 24 having its drain connected to the gate of the seventh MOS transistor 21, its source connected to the gate of the ninth MOS transistor 23 and its gate being connected to receive the supply voltage Vcc of the integrated circuit.

When the first circuit receives a logic "1", corresponding substantially to the supply voltage Vcc at its first input, the fifth transistor 13 is on and the sixth transistor 14 is off. The fourth transistor 12 receiving 0 volts at its gate is also on, thus turning the third transistor 11 off. When the first circuit receives a logic "0" corresponding substantially to the ground voltage GND at its first input, the fifth transistor 13 is off and the sixth transistor 14 is on. The third transistor 11 receiving 0 volts at its gate is also on, turning the fourth transistor 12 off. The first and second switch circuits 1 and 2 have been chosen for: their low power consumption, the fact that they occupy a limited amount of space, and the simplicity of their implementation.

Other variants may be achieved by those skilled in the art without departing from the framework of the invention. It is possible, for example, to convert the circuit described into a negative voltage selector circuit. This can be done, for example, by replacing the NMOS transistors with PMOS transistors, the PMOS transistors with NMOS well transistors, and to invert the supply voltage Vcc with the ground.

That which is claimed is:

1. A selector circuit for switching to a first voltage or to a second voltage as a function of a control signal, the selector circuit comprising:

a first switch circuit receiving the first voltage and the control signal and generating, at an output, either the first voltage when the control signal is in a first state or a first reference voltage when the control signal is in a second state;

a second switch circuit receiving the second voltage and the control signal and generating, at an output, either the second voltage when the control signal is in the second state or the first reference voltage when the control signal is in the first state;

a first MOS transistor of a first type having a source connected to the output of the first switch circuit, having a gate connected to the output of the second switch circuit, and having a drain connected to a well thereof; and a second MOS transistor of the first type having a source connected to the output of the second switch circuit, having a gate connected to the output of the first switch circuit, and having a drain connected to the well thereof and to the drain of the first MOS transistor.

2. A selector circuit according to claim 1, wherein the first and second MOS transistors are in a same first well.

3. A selector circuit according to claim 2; wherein the first switch circuit comprises a plurality of MOS transistors of the first type in a second well receiving the first voltage.

4. A selector circuit according to claim 2, wherein the second switch circuit comprises a plurality of MOS transistors of the first type in an additional well receiving the second voltage.

5. A selector circuit according to claim 1, wherein the first switch circuit comprises:

a third MOS transistor of the first type a having a drain defining an output of the first switch circuit, and having a source connected to a well thereof and receiving the first voltage;

a fourth MOS transistor of the first type having a source connected to a well thereof and to the source of the third MOS transistor, having a gate connected to the drain of the third MOS transistor, and having a drain connected to the gate of the third MOS transistor;

a fifth MOS transistor of a second type having a drain connected to the drain of the third MOS transistor, having a source receiving the first reference voltage, and having a gate receiving an inverted control signal; and a sixth MOS transistor of the second type having a drain connected to the gate of the third MOS transistor, having a source connected to the gate of the fifth MOS transistor, and having a gate receiving the second reference voltage.

6. A selector circuit according to claim 5, wherein the second switch circuit comprises:

a seventh MOS transistor of the first type, having a drain defining an output of the second switch circuit, and having a source being connected to a well thereof and receiving the second voltage;

an eighth MOS transistor of the first type having a source connected to a well thereof and to the source of the seventh MOS transistor, having a gate connected to the drain of the seventh MOS transistor, and having a drain connected to the gate of the seventh MOS transistor;

a ninth MOS transistor of a second type having a drain connected to the drain of the seventh MOS transistor, having a source connected to receive the first reference voltage, and having a gate receiving the control signal; and a tenth MOS transistor of the second type having a drain connected to the gate of the seventh MOS transistor, having a source connected to the gate of the ninth MOS transistor, and having a gate receiving the second reference voltage.

7. A selector circuit for switching to a first voltage or to a second voltage as a function of a control signal, the selector circuit comprising:

a first switch circuit comprising a plurality of MOS transistors and receiving the first voltage and the control signal and generating, at an output, either the first voltage when the control signal is in a first state or a first reference voltage when the control signal is in a second state;

a second switch circuit comprising a plurality of MOS transistors receiving the second voltage and the control signal and generating, at an output, either the second voltage when the control signal is in the second state or the first reference voltage when the control signal is in the first state;

a first MOS transistor of a first type having a source connected to the output of the first switch circuit, having a gate connected to the output of the second switch circuit, and having a drain connected to a first well; and a second MOS transistor of the first type having a source connected to the output of the second switch circuit, having a gate connected to the output of the first switch circuit, and having a drain connected to the well thereof and to the drain of the first MOS transistor, the second MOS transistor in the first well.

8. A selector circuit according to claim 7, wherein the plurality of MOS transistors of the first switch circuit comprise MOS transistors of the first type in a second well receiving the first voltage.

9. A selector circuit according to claim 7, wherein the plurality of MOS transistors of the second switch circuit comprise MOS transistors of the first type in an additional well receiving the second voltage.

10. A selector circuit according to claim 7, wherein the plurality of MOS transistors of the first switch circuit comprise:

a third MOS transistor of the first type a having a drain defining an output of the first switch circuit, and having a source connected to a well thereof and receiving the first voltage;

a fourth MOS transistor of the first type having a source connected to a well thereof and to the source of the third MOS transistor, having a gate connected to the drain of the third MOS transistor, and having a drain connected to the gate of the third MOS transistor;

a fifth MOS transistor of a second type having a drain connected to the drain of the third MOS transistor, having a source receiving the first reference voltage, and having a gate receiving an inverted control signal; and a sixth MOS transistor of the second type having a drain connected to the gate of the third MOS transistor, having a source connected to the gate of the fifth MOS transistor, and having a gate receiving the second reference voltage.

11. A selector circuit according to claim 10, wherein the plurality of MOS transistors of the second switch circuit comprise:

a seventh MOS transistor of the first type, having a drain defining an output of the second switch circuit, and having a source being connected to a well thereof and receiving the second voltage;

an eighth MOS transistor of the first type having a source connected to a well thereof and to the source of the seventh MOS transistor, having a gate connected to the drain of the seventh MOS transistor, and having a drain connected to the gate of the seventh MOS transistor;

a ninth MOS transistor of a second type having a drain connected to the drain of the seventh MOS transistor, having a source receiving the first reference voltage, and having a gate receiving the control signal; and a tenth MOS transistor of the second type having a drain connected to the gate of the seventh MOS transistor, having a source connected to the gate of the ninth MOS transistor, and having a gate receiving the second reference voltage.

12. An integrated circuit comprising:

a first node for a first voltage and a second node for a second voltage; and a selector circuit for switching to the first voltage or to the second voltage as a function of a control signal, the selector circuit comprising a first switch circuit receiving the first voltage and the control signal and generating, at an output, either the first voltage when the control signal is in a first state or a first reference voltage when the control signal is in a second state, a second switch circuit receiving the second voltage and the control signal and generating, at an output, either the second voltage when the control signal is in the second state or the first reference voltage when the control signal is in the first state, a first MOS transistor of a first type having a source connected to the output of the first switch circuit, having a gate connected to the output of the second switch circuit, and having a drain connected to a well thereof, and a second MOS transistor of the first type having a source connected to the output of the second switch circuit, having a gate connected to the output of the first switch circuit, and having a drain connected to the well thereof and to the drain of the first MOS transistor.

13. An integrated circuit according to claim 12, wherein the first and second MOS transistors are in a same first well.

14. An integrated circuit according to claim 13, wherein the first switch circuit comprises a plurality of MOS transistors of the first type in a second well receiving the first voltage.

15. An integrated circuit according to claim 12, wherein the second switch circuit comprises a plurality of MOS transistors of the first type in an additional well receiving the second voltage.

16. An integrated circuit according to claim 12, wherein the first switch circuit comprises:

a third MOS transistor of the first type a having a drain defining an output of the first switch circuit, and having a source connected to a well thereof and receiving the first voltage;

a fourth MOS transistor of the first type having a source connected to a well thereof and to the source of the third MOS transistor, having a gate connected to the drain of the third MOS transistor, and having a drain connected to the gate of the third MOS transistor;

a fifth MOS transistor of a second type having a drain connected to the drain of the third MOS transistor, having a source receiving the first reference voltage, and having a gate receiving an inverted control signal; and a sixth MOS transistor of the second type having a drain connected to the gate of the third MOS transistor, having a source connected to the gate of the fifth MOS transistor, and having a gate receiving the second reference voltage.

17. An integrated circuit according to claim 16, wherein the second switch circuit comprises:

a seventh MOS transistor of the first type, having a drain defining an output of the second switch circuit, and having a source being connected to a well thereof and receiving the second voltage;

an eighth MOS transistor of the first type having a source connected to a well thereof and to the source of the seventh MOS transistor, having a gate connected to the drain of the seventh MOS transistor, and having a drain connected to the gate of the seventh MOS transistor;

a ninth MOS transistor of a second type having a drain connected to the drain of the seventh MOS transistor, having a source connected to receive the first reference voltage, and having a gate receiving the control signal; and a tenth MOS transistor of the second type having a drain connected to the gate of the seventh MOS transistor, having a source connected to the gate of the ninth MOS transistor, and having a gate receiving the second reference voltage.

* * * * *